(12) United States Patent
Saito et al.

(10) Patent No.: US 11,268,874 B2
(45) Date of Patent: Mar. 8, 2022

(54) DEFECT JUDGING UNIT OF MEASURING PROBE AND DEFECT JUDGING METHOD THEREOF

(71) Applicant: MITUTOYO CORPORATION, Kanagawa (JP)

(72) Inventors: Akinori Saito, Ibaraki (JP); Satoshi Koga, Ibaraki (JP); Hiroyuki Kanamori, Ibaraki (JP)

(73) Assignee: MITUTOYO CORPORATION, Kanagawa (JP)

( * ) Notice: Subject to any disclaimer, the term of this patent is extended or adjusted under 35 U.S.C. 154(b) by 15 days.

(21) Appl. No.: 16/892,708

(22) Filed: Jun. 4, 2020

(65) Prior Publication Data
US 2020/0386646 A1    Dec. 10, 2020

(30) Foreign Application Priority Data

Jun. 7, 2019    (JP) .............................. JP2019-107515

(51) Int. Cl.
*G01L 25/00*    (2006.01)
*G01L 1/22*    (2006.01)
(Continued)

(52) U.S. Cl.
CPC .............. *G01L 25/00* (2013.01); *G01B 5/016* (2013.01); *G01L 1/22* (2013.01)

(58) Field of Classification Search
CPC . G01B 5/00; G01B 5/008; G01B 7/00; G01B 7/012; G01B 3/22; G01B 7/24;
(Continued)

(56) References Cited

U.S. PATENT DOCUMENTS

| 4,817,362 A | 4/1989 | Archer |
| 5,345,689 A * | 9/1994 | McMurtry ............. G01B 3/008 |
| | | 33/556 |

(Continued)

FOREIGN PATENT DOCUMENTS

| JP | 6212148 | 9/2017 |
| JP | 2020-85747 A | 6/2020 |

OTHER PUBLICATIONS

Official Communication issued in European Patent Office (EPO) Patent Application No. 20178440.2, dated Nov. 5, 2020.
Office Action issued in Japanese Counterpart Patent Appl. No. 2019-107515, dated Mar. 9, 2021, along with an English translation thereof.
(Continued)

*Primary Examiner* — Brandi N Hopkins
(74) *Attorney, Agent, or Firm* — Greenblum & Bernstein, P.L.C.

(57) ABSTRACT

Provided is a defect judging unit for a measuring probe including: a stylus; four detection elements; and a signal processing part. The defect judging unit includes a defect judging part configured to compare four judged signals corresponding to the generated signals with predetermined thresholds when the object to be measured and the contact part are out of contact with each other and judge that a defect exists if any of the judged signals is greater than the predetermined threshold, and a judged result output part configured to output a judged result of the defect judging part. According to this configuration, the defect judging unit of the measuring probe and the defect judging method thereof capable of ensuring measurement reliability with a simple configuration are provided.

14 Claims, 14 Drawing Sheets

(51) Int. Cl.
*G01B 21/04* (2006.01)
*G01B 5/016* (2006.01)

(58) Field of Classification Search
CPC .... B66B 1/18; G01N 29/045; G01N 27/9046; G01N 27/82; G01N 21/95607; G01N 2291/044; G01N 29/30; G01N 29/11; G01N 29/4427; G06F 3/04186; G06F 3/04182; G06F 1/1694; G01R 31/2853; G01R 27/08; G01R 31/311; G01R 33/0041; G01R 21/06; G01R 31/52; G01R 31/003; G01R 31/316; G06T 7/001; G01D 18/008; G01D 5/366; G11B 9/14; G01Q 60/08; G01Q 60/30
See application file for complete search history.

(56) References Cited

U.S. PATENT DOCUMENTS

| | | | |
|---|---|---|---|
| RE45,211 E * | 10/2014 | McFarland | G01B 5/012 356/614 |
| 9,454,145 B2 * | 9/2016 | Collingwood | G01B 7/00 |
| 10,415,949 B2 | 9/2019 | Koga et al. | |
| 2009/0320553 A1 | 12/2009 | Weston et al. | |
| 2017/0248402 A1 | 8/2017 | Koga et al. | |
| 2017/0328697 A1 | 11/2017 | Jansson | |
| 2020/0166336 A1 | 5/2020 | Koga et al. | |

OTHER PUBLICATIONS

First Chinese Office Action in Corresponding Application No. 202010506921.0, dated Aug. 31, 2021, along with an English translation thereof.

* cited by examiner

DEFECT JUDGING UNIT OF MEASURING PROBE AND DEFECT JUDGING METHOD THEREOF

CROSS-REFERENCE TO RELATED APPLICATION

The disclosure of Japanese Patent Application No. 2019-107515 filed on Jun. 7, 2019 including specifications, drawings and claims is incorporated herein by reference in its entirety.

TECHNICAL FIELD

The present invention relates to a defect judging unit of a measuring probe and a defect judging method thereof, and in particular to a defect judging unit of a measuring probe and a defect judging method thereof capable of ensuring measurement reliability with a simple configuration.

BACKGROUND ART

A measuring probe as described in Japanese Patent No. 6212148 has been proposed in the conventional technique. Such a measuring probe includes: a stylus having a contact part to be in contact with an object to be measured; a probe housing capable of supporting the stylus on an axial center; a detection element capable of detecting a movement of the contact part; and a signal processing circuit for processing an output of the detection element. The signal processing circuit processes a sensor signal outputted from the detection element to output a touch signal to the outside. This touch signal allows for accurately measuring the shape of the object to be measured.

SUMMARY OF INVENTION

Technical Problem

With the measuring probe as described in Japanese Patent No. 6212148, however, even when a defect affecting measurement accuracy occurs therein, a user may continue to use the measuring probe without being aware of the defect. In this case, it later turns out that the measured results have problems, and thus such measured results go to waste. The possibility of such circumstances can eventually lower the reliability of measurements made by the measuring probe.

The present invention has been made in order to solve the above-described problems in the conventional technique, and an object thereof is to provide a defect judging unit of a measuring probe and a defect judging method thereof capable of ensuring measurement reliability with a simple configuration.

Solution to Problem

To solve the above-described problems, an aspect of the present invention provides a defect judging unit of a measuring probe including: a stylus having a contact part to be in contact with an object to be measured; at least one detection element capable of detecting a movement of the contact part; and a signal processing device configured to process a generated signal obtained from an output of the at least one detection element to output a touch signal. The defect judging unit includes: a defect judging circuit configured to compare at least one judged signal corresponding to the generated signal with a predetermined threshold when the object to be measured and the contact part are out of contact with each other and judge that a defect exists if any of the at least one judged signal is greater than the predetermined threshold; and a judged result output device configured to output a judged result of the defect judging circuit.

A second aspect of the present invention provides the defect judging unit further including a signal amplifying circuit configured to amplify the output of the at least one detection element, the signal amplifying circuit being provided before the signal processing device. Here, the generated signal is an amplified signal of the signal amplifying circuit.

A third aspect of the present invention provides the defect judging unit further including an offset correction circuit configured to filter the amplified signal, the offset correction circuit being provided between the signal amplifying circuit and the signal processing device.

A fourth aspect of the present invention provides the defect judging unit further including: a signal amplifying circuit configured to perform differential amplification of the output of the at least one detection element; and a feedback-type offset correction circuit connected to an input terminal and an output terminal of the signal amplifying circuit. Here, the generated signal is an offset signal outputted from the offset correction circuit and used to obtain a difference from the output of the at least one detection element in the signal amplifying circuit.

A fifth aspect of the present invention provides the defect judging unit further including: a D/A converter configured to convert an output of the offset correction circuit to an analog signal, the D/A converter being provided between the offset correction circuit and the signal amplifying circuit; and an A/D converter configured to convert an output of the signal amplifying circuit to a digital signal, the A/D converter being provided between the signal amplifying circuit and the signal processing device. Here, an input signal from the signal amplifying circuit into the offset correction circuit is a digital amplified signal via the A/D converter. The generated signal is a digital offset signal to be inputted into the signal amplifying circuit via the D/A converter. The signal processing device, the offset correction circuit, and the defect judging circuit constitute a digital signal processing device.

A sixth aspect of the present invention provides the defect judging unit in which the measuring probe further includes: a probe housing capable of supporting the stylus on an axial center; and at least one supporter having a rotationally symmetric shape and disposed in an axial direction of the probe housing so as to allow for an orientation change of the stylus. Here, four said detection elements are disposed at fourfold symmetry positions on deformable arms of the at least one supporter.

A seventh aspect of the present invention provides the defect judging unit in which the detection element is a strain gauge.

An eighth aspect of the present invention provides the defect judging unit in which the judged signal is a fixed difference value being a difference between the generated signal and a predetermined fixed value, the predetermined threshold is a fixed threshold determined corresponding to the fixed difference value, and the defect judging circuit is configured to compare the fixed difference value with the fixed threshold.

A ninth aspect of the present invention provides the defect judging unit in which the judged signal includes: a fixed difference value being a difference between the generated signal and a predetermined fixed value; and a variable difference value being a difference between currently-obtained said generated signals and a variable reference signal that is any one of the currently-obtained generated signals or an average of all of the currently-obtained generated signals. Furthermore, the predetermined threshold includes: a fixed threshold corresponding to the fixed difference value; and a variable threshold corresponding to the variable difference value. The defect judging circuit is configured to compare the fixed difference value with the fixed threshold and compare the variable difference value with the variable threshold.

A tenth aspect of the present invention provides the defect judging unit in which the predetermined fixed value is a generated signal initially obtained when the detection element is integrated into the measuring probe.

An eleventh aspect of the present invention provides the defect judging unit in which the judged signal is a variable difference value being a difference between currently-obtained said generated signals and a variable reference signal that is any one of the currently-obtained generated signals, and the predetermined threshold is a variable threshold corresponding to the variable difference value. Here, the defect judging circuit is configured to compare the variable difference value with the variable threshold.

A twelfth aspect of the present invention provides the defect judging unit in which the judged signal is a variable difference value being a difference between currently-obtained said generated signals and a variable reference signal that is an average of all of the currently-obtained generated signals, and the predetermined threshold is a variable threshold corresponding to the variable difference value. Here, the defect judging circuit is configured to compare the variable difference value with the variable threshold.

A thirteenth aspect of the present invention provides the defect judging unit in which the predetermined threshold is a value different for each judged signal.

A fourteenth aspect of the present invention provides the defect judging unit in which two or more said predetermined thresholds are provided for a single said judged signal, and the judged result output device is configured to output a level of the defect in two or more levels.

A fifteenth aspect of the present invention provides the defect judging unit in which the judged result output device is configured to include a display by which the judged result can be recognized.

A sixteenth aspect of the present invention provides a defect judging method of a measuring probe including: a stylus having a contact part to be in contact with an object to be measured; at least one detection element capable of detecting a movement of the contact part; and a signal processing device configured to process a generated signal obtained from an output of the at least one detection element to output a touch signal. The defect judging method includes the steps of: keeping the contact part out of contact with the object to be measured; comparing at least one judged signal corresponding to the generated signal with a predetermined threshold; and judging that a defect exists if any of the at least one judged signal is greater than the predetermined threshold and outputting a judged result.

The present invention can provide the defect judging unit of the measuring probe and the defect judging method thereof capable of ensuring measurement reliability with a simple configuration.

These and other novel features and advantages of the present invention will become apparent from the following detailed description of preferred embodiments.

BRIEF DESCRIPTION OF DRAWINGS

The preferred embodiments will be described with reference to the drawings, wherein like elements have been denoted throughout the figures with like reference numerals, and wherein.

DESCRIPTION OF EMBODIMENTS

An example of embodiments of the present invention will be described below in detail with reference to the drawings.

A measuring system according to a first embodiment of the present invention will be described with reference to FIGS. 1 to 6.

An overall configuration of a measuring system 100 will be described first.

Figure 1:
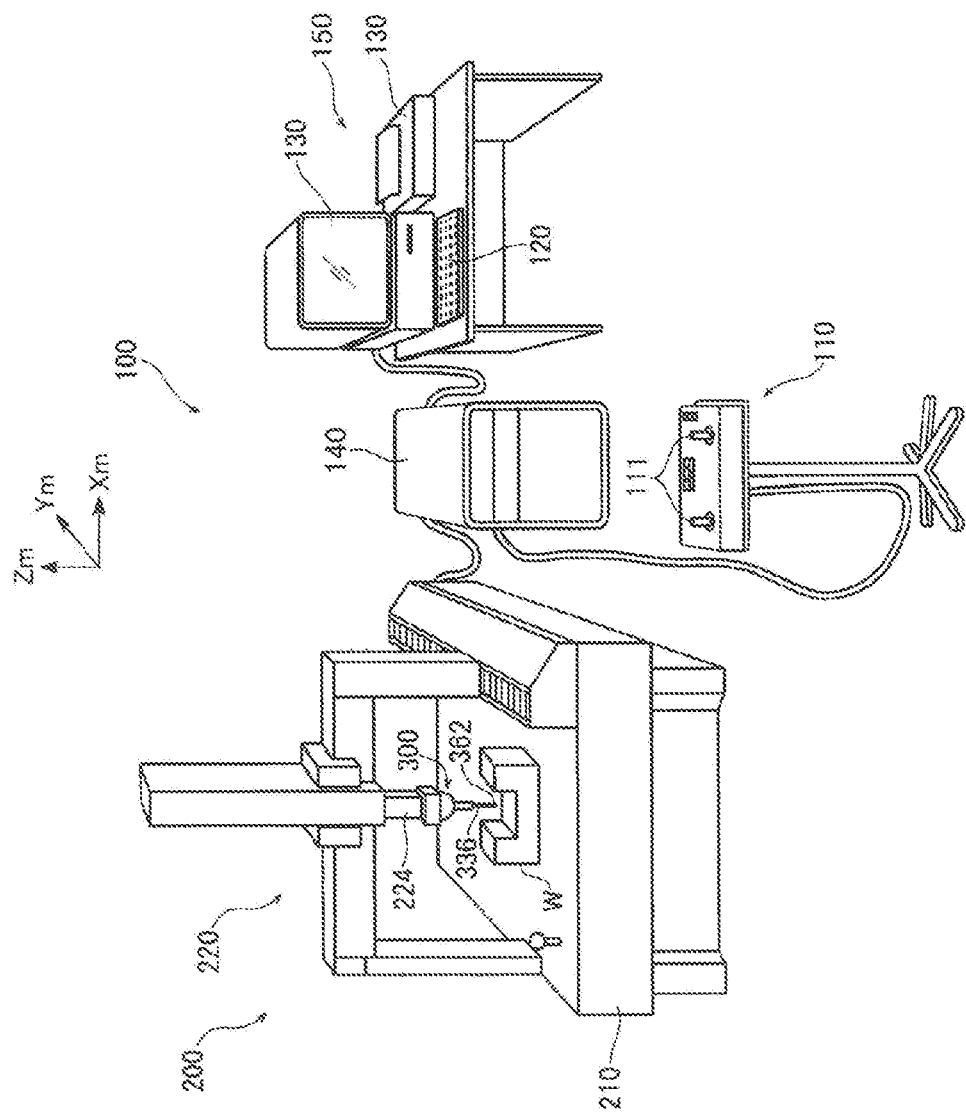
FIG. 1 is a schematic diagram illustrating an example of a measuring system using a measuring probe according to a first embodiment of the present invention.

As illustrated in FIG. 1, the measuring system 100 includes: a coordinate measuring machine 200 configured to move a measuring probe 300; an operation part 110 having manually-operated joysticks 111; and a motion controller 140 configured to control operations of the coordinate measuring machine 200. The measuring system 100 also includes: a host computer 150 configured to operate the coordinate measuring machine 200 via the motion controller 140 and process measured data acquired by the coordinate measuring machine 200 to obtain, for example, dimensions or a shape of an object W to be measured; an input unit 120 configured to input, for example, measurement conditions; and an output unit 130 configured to output, for example, measured results.

As illustrated in FIG. 1, the coordinate measuring machine 200 includes: the measuring probe 300; a surface plate 210; a drive mechanism 220 which is provided to stand on the surface plate 210 and configured to move the measuring probe 300 three-dimensionally; and a drive sensor (not illustrated) configured to detect a drive amount of the drive mechanism 220. In the present embodiment, a configuration of the measuring probe 300 provided with a defect judging part (a defect judging circuit) 372 and a judged result output part (a judged result output device) 390 is referred to as a defect judging unit 370.

A general configuration of the measuring probe 300 will be described next.

Figure 2:
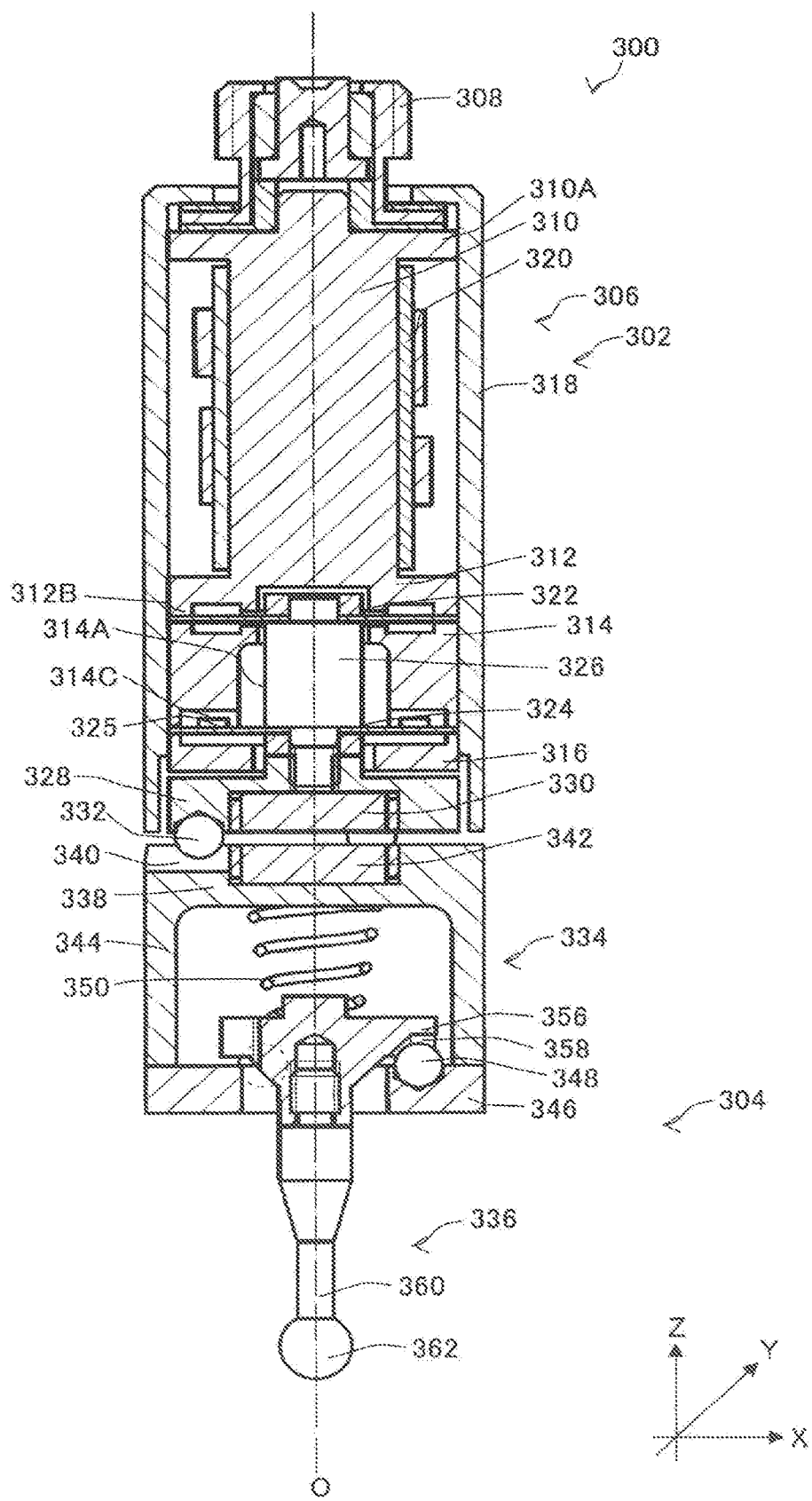
FIG. 2 is a schematic diagram illustrating a cross-section of the measuring probe of FIG. 1.

As illustrated in FIG. 2, the measuring probe 300 includes: a stylus 336 having a contact part 362 to be in contact with the object W to be measured; a probe housing 306 configured to be capable of supporting the stylus 336 on an axial center O; one or more (four in the present embodiment) detection elements 325 configured to be capable of detecting movements of the contact part 362 deviating from the axial center O and along the axial center O; and a signal processing circuit 320 configured to process outputs of the four detection elements 325 to output a touch signal Str (digital signal). Specifically, the measuring probe 300 is referred to also as a touch signal probe. Note that the stylus 336 is included in a stylus module 304, and the probe housing 306 and the detection elements 325 are included in a probe main body 302. The probe main body 302 is supported by a spindle 224 of the drive mechanism 220. The stylus module 304 is detachably coupled to the probe main body 302 with high positional reproducibility via a kinematic joint, which will be described later.

The measuring probe 300 will be described below in detail. For the purpose of the following description, the longitudinal direction on the plane of paper in FIG. 2 is defined as a Z-direction, the horizontal direction on the plane of paper is defined as an X-direction, and the vertical direction to the plane of paper is defined as a Y-direction. The direction of the axial center O (axial direction O) of the measuring probe 300 therefore coincides with the Z-direction.

As illustrated in FIG. 2, the probe main body 302 includes the probe housing 306, the signal processing circuit 320, supporting members (supporters) 322 and 324, the detection elements 325, a coupling shaft 326, a flange member 328, a permanent magnet 330, and balls 332.

As illustrated in FIG. 2, the probe housing 306 includes an attachment part 308, a circuit placement part 310, a fixing member 314, a bottom member 316, and a main body cover 318.

As illustrated in FIG. 2, the attachment part 308 is a part to be attached to the spindle 224 at the upper end part of the measuring probe 300. The circuit placement part 310 is disposed at a lower end of the attachment part 308. A cross-section of the circuit placement part 310 perpendicular to the axial center O has a generally triangular shape except for a disc-shaped upper end part 310A and a disc-shaped lower flange 312 provided at a lower end of the circuit placement part 310. The signal processing circuit 320, the defect judging part 372, and the judged result output part 390 are disposed on the outer periphery of the generally triangular shape. The circuit placement part 310 is disposed above the supporting members 322 and 324.

As illustrated in FIG. 2, the fixing member 314 is fixed to a lower end peripheral part 312B of the lower flange 312 with the supporting member 322 interposed therebetween. The fixing member 314 has a cylindrical shape provided with an opening 314A on the axial center O. A lower end inner surface of the fixing member 314 is provided with four recesses 314C at fourfold symmetry positions. The bottom member 316 is fixed to a lower end peripheral part of the fixing member 314 with the supporting member 324 interposed therebetween. The bottom member 316 has an annular shape. The main body cover 318 has a cylindrical shape and is disposed around the circuit placement part 310, the lower flange 312, the fixing member 314, and the bottom member 316 in such a manner as to cover all of the signal processing circuit 320 and the defect judging part 372. The main body cover 318 is fixed to the fixing member 314 with bolts.

Figure 3:
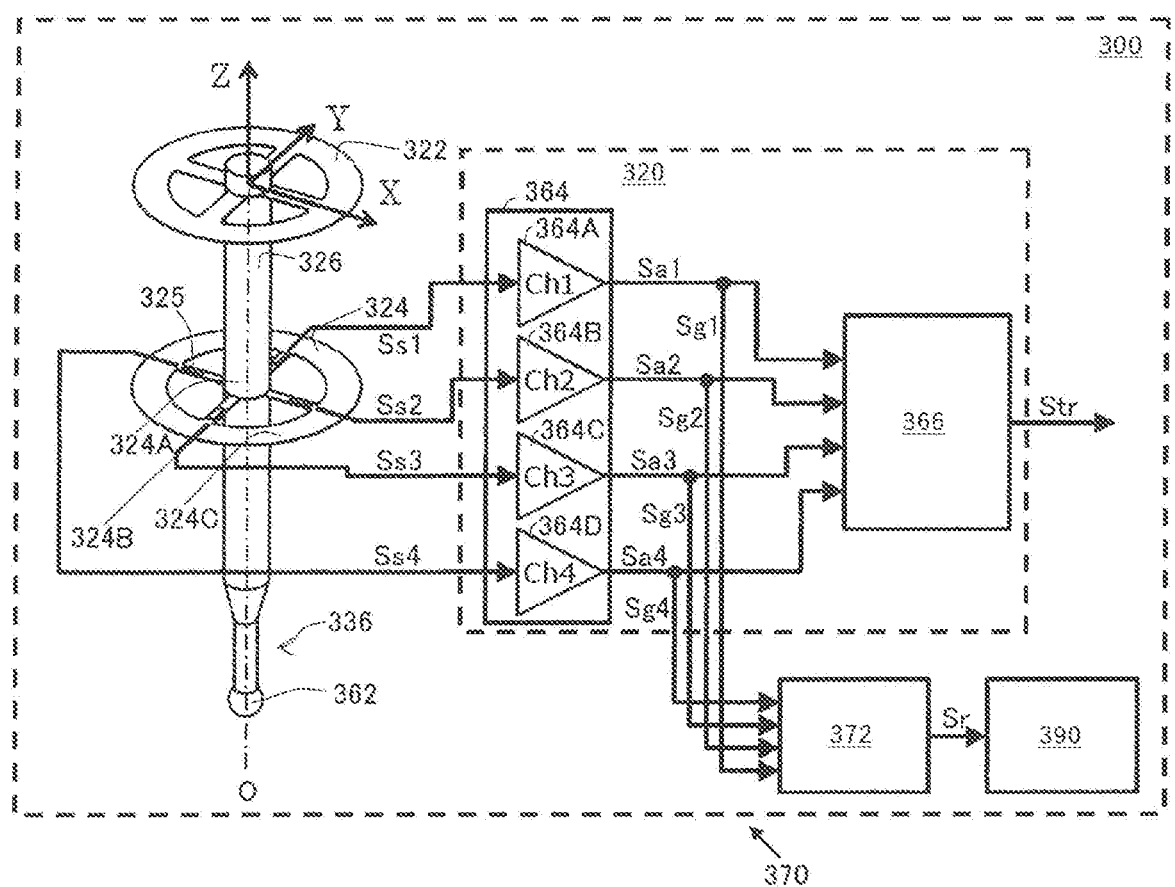
FIG. 3 is a block diagram showing a relationship between the measuring probe of FIG. 2 and a defect judging unit.

As illustrated in FIG. 3, the signal processing circuit 320 is a circuit configured to process outputs of the detection elements 325 to output the touch signal (contact sensing signal) Str for notifying that the contact part 362 is in contact with the object W to be measured. The signal processing circuit 320 includes a signal amplifying part (a signal amplifying circuit) 364 and a signal processing part (a signal processing device) 366. The signal amplifying part 364 includes amplifiers 364A to 364D configured to amplify respective sensor signals Ss (Ss1 to Ss4), which are the outputs of the detection elements 325, to output amplified signals Sa (Sa1 to Sa4), respectively. Note that reference signs Ch1 to Ch4 denote channels 1 to 4, respectively. The signal processing part 366 processes the amplified signals Sa to output the touch signal Str. That is, the signal amplifying part 364 configured to amplify the respective outputs of the detection elements 325 is provided before the signal processing part 366 in the present embodiment, and generated signals Sg (Sg1 to Sg4) are the amplified signals Sa of the signal amplifying part 364. The signal processing part 366 is configured to process the generated signals Sg obtained from the outputs of the four detection elements 325 so as to output the touch signal Str. The signal processing part 366 is configured to obtain deflection amounts in the three X-, Y-, and Z-directions from the generated signals Sg (Sg1 to Sg4), synthesize the deflection amounts in the three directions, and output the touch signal Str when the contact part 362 moves a given displacement or more. Note that a bridge circuit may be formed in the signal amplifying part, or a bridge circuit may be formed in the signal processing part.

Figure 4:
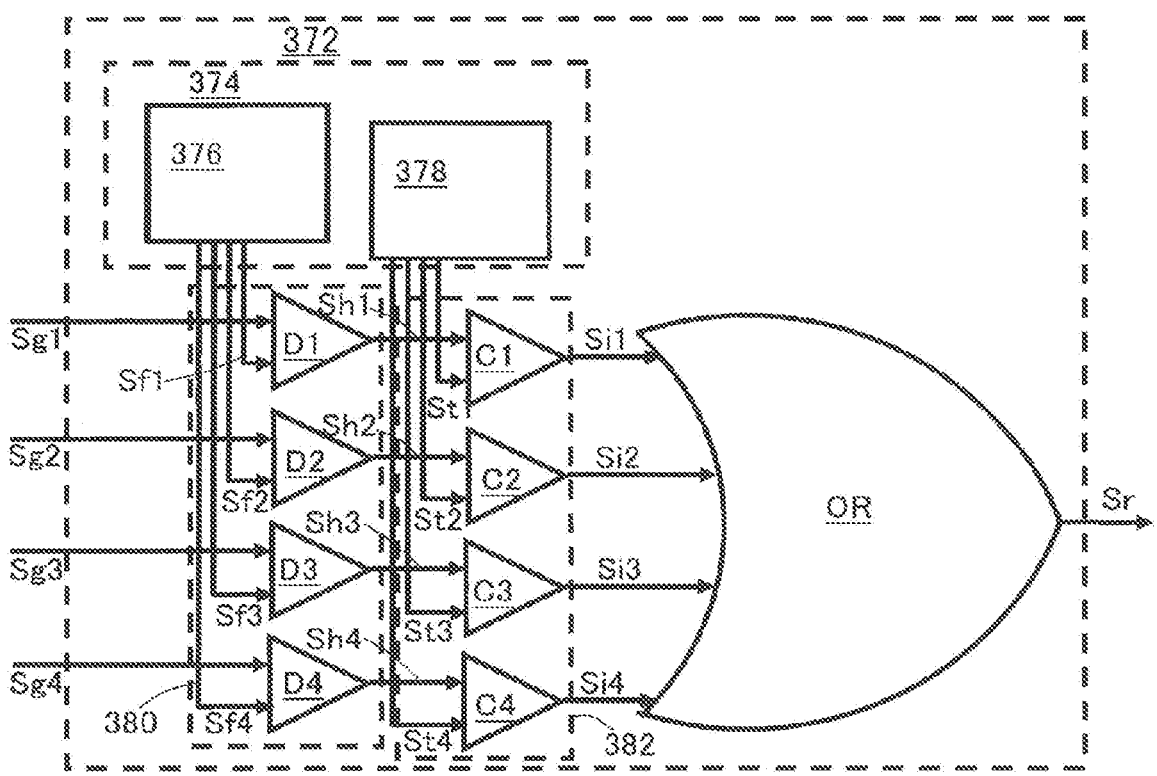
FIG. 4 is a block diagram showing a configuration of a defect judging part of FIG. 3.

The defect judging part 372 compares four judged signals Sh (Sh1 to Sh4) corresponding to the generated signals Sg with predetermined thresholds St (St1 to St4) when the object W to be measured and the contact part 362 are not in contact with each other. If any of the judged signals Sh is greater than the predetermined threshold St, it is judged that a defect exists. Specifically, the defect judging part 372 includes a storage part 374, a fixed difference part 380, a fixed comparison part 382, and an operator OR as illustrated in FIG. 4. The storage part 374 includes a fixed value storage part 376 configured to store predetermined fixed values Sf (Sf1 to Sf4), and a threshold storage part 378 configured to store the predetermined thresholds St (St1 to St4).

The predetermined fixed values Sf are the generated signals Sg initially obtained when the detection elements 325 are integrated into the measuring probe 300. The generated signals Sg in this case vary for each of the detection elements 325. The predetermined thresholds St have values different for each of the judged signals Sh. The fixed difference part 380 obtains fixed difference values, which are differences between the generated signals Sg (Sg1 to Sg4) and the predetermined fixed values Sf (Sf1 to Sf4), as the judged signals Sh (Sh1 to Sh4) in respective differentiators D1 to D4. The fixed comparison part 382 compares the judged signals Sh (Sh1 to Sh4) with the predetermined thresholds St (St1 to St4) in respective comparators C1 to C4. If the judged signals Sh are greater than the predetermined thresholds St, which represents an NG case, the fixed comparison part 382 outputs individual result signals Si (Si1 to Si4) at an H level. On the other hand, if the judged signals Sh are smaller than or equal to the predetermined thresholds St, which represents an OK case, the fixed comparison part 382 outputs the individual result signals Si at an L level. Note that the predetermined thresholds St are fixed thresholds determined corresponding to the fixed difference values. Specifically, the defect judging part 372 compares the fixed difference values with the fixed thresholds, respectively. The operator OR outputs an H-level signal as a result signal Sr only when any of the individual result signals Si is at the H level.

In the present embodiment, the judged signals Sh are obtained by using a voltage proportional to a resistance value of the detection element 325 in the defect judging part 372. A defect judgment, however, may be made after a resistance value of the detection element 325 is obtained in the defect judging part 372.

As illustrated in FIG. 3, the judged result output part 390 outputs a judged result of the defect judging part 372. Specifically, the judged result output part 390 includes a display part (a display) (not illustrated, which displays a defect by blinking one or more LEDs at given intervals, for example) by which the judged result can be recognized. The judged result output part 390 is configured so that only the display part is not covered by the main body cover 318.

As illustrated in FIG. 2, the supporting members 322 and 324 are elastically-deformable members disposed in the axial direction O of the probe housing 306 and allowing for orientation changes of the stylus 336. Specifically, the supporting member 324 has a rotationally symmetric shape including a total of four deformable arm parts (four deformable arms) 324B at positions displaced from each other by an angle of 90 degrees in a circumferential direction (around the axial center O) as illustrated in FIG. 3. These four arm parts 324B are formed on the same plane. The supporting members 322 and 324 have the same thickness and the same structure except for widths of the respective arm parts. Without being limited thereto, the thicknesses, lengths, and shapes of the arm parts may be different from each other, or the entire supporting members 322 and 324 may have shapes different from each other. Thus, the supporting member 324 in which the detection elements 325 are disposed will be described below, and any overlapping description on the supporting member 322 will be omitted. Note that the shape of the supporting members is not limited to that shown in the present embodiment, and it is only necessary that at least one supporting member be provided.

As illustrated in FIG. 3, the supporting member 324 has a generally circular plate shape, and includes, in addition to the rectangular arm parts 324B, a central part 324A to be connected to the coupling shaft 326, and a peripheral part 324C that is coupled to the central part 324A by the arm parts 324B and that is connected to the probe housing 306. The peripheral part 324C is located at the outermost position of the supporting member 324. The arm parts 324B are disposed on an inner side of the peripheral part 324C in such a manner as to extend linearly in a radial direction. The central part 324A is disposed on an inner side of the arm parts 324B. The supporting member 324 is configured such that a displacement of the coupling shaft 326 with respect to the probe housing 306 causes the central part 324A to move up, down, left, or right and thereby causes the arm parts 324B to be elastically deformed accordingly.

The detection elements 325 are, for example, strain gauges to be affixed and detect a strain of the supporting member 324 in which the detection elements 325 are disposed as illustrated in FIG. 3. The four detection elements 325 are disposed at fourfold symmetry positions on the respective deformable arm parts 324B of the supporting member 324. The detection elements 325 are fixed to the arm parts 324B with an adhesive, for example. While a general-purpose strain gauge may be used, a temperature-compensated strain gauge may be used instead. Furthermore, from the standpoint of temperature compensation, temperature correction may be made by integrating a dummy strain gauge for temperature compensation into a bridge circuit (not illustrated), for example.

As illustrated in FIGS. 2 and 3, the coupling shaft 326 has a generally cylindrical shape, and couples the two supporting members 322 and 324 together. The coupling shaft 326 is held on the axial center O by the two supporting members 322 and 324 without being in contact with the lower flange 312, the fixing member 314, and the bottom member 316. The coupling shaft 326 integrally supports the flange member 328.

As illustrated in FIG. 2, the flange member 328 has a generally disc shape. The flange member 328 faces the bottom member 316 in the axial direction O in a non-contact manner and faces the main body cover 318 in the radial direction in a non-contact manner. The flange member 328 supports the stylus module 304. At least a part of a gap between the bottom member 316 and the flange member 328 is filled with a viscous material such as a grease oil. The permanent magnet 330 is fixed, on the axial center O, to a lower surface of the flange member 328. In a lower end outer region of the flange member 328, the three balls 332 are disposed in a rotationally symmetric manner at an interval of 120 degrees in the circumferential direction so as to surround the permanent magnet 330.

As illustrated in FIG. 2, the stylus module 304 includes an over-travel mechanism 334, and the stylus 336 supported by the over-travel mechanism 334.

As illustrated in FIG. 2, the over-travel mechanism 334 is a mechanism configured to change the position of the stylus 336 when a large force greater than a measuring force in outputting the touch signal Str is applied to the stylus 336, and to automatically restore the position of the stylus 336 when such a large force disappears. Specifically, the over-travel mechanism 334 includes a flange part 338, an extended part 344, a stylus holder 346, and a coil spring 350.

As illustrated in FIG. 2, the flange part 338 is a member corresponding to the flange member 328. That is, three V-grooves 340 are disposed at an interval of 120 degrees in the circumferential direction of the flange part 338 so as to be in contact with the balls 332. A magnetic member 342, which may be a permanent magnet, to be attracted to the permanent magnet 330 is disposed in the flange part 338 so as to face the permanent magnet 330. Specifically, the flange part 338 and the flange member 328 constitute a kinematic joint, which is a detachable coupling mechanism. As illustrated in FIG. 2, the extended part 344 is integrally formed with a periphery of the flange part 338 and houses therein the coil spring 350 expandable in the axial direction O. The stylus holder 346 is provided at an end of the extended part 344 in the axial direction O and connected to the extended part 344 with volts. The stylus holder 346 movably supports, at its upper surface closer to the coil spring 350, a flange part 356 of the stylus 336 pressed by the coil spring 350. Three balls 348 are disposed on the upper surface of the stylus holder 346 closer to the coil spring 350 at an interval of 120 degrees in the circumferential direction. Three V-grooves 358 are disposed on a lower surface of the flange part 356 at an interval of 120 degrees in the circumferential direction so as to correspond to the balls 348. Specifically, it can be said that the stylus holder 346 and the flange part 356 constitute the aforementioned kinematic joint.

Thus, the over-travel mechanism 334 can achieve high positioning reproducibility of the stylus 336 with respect to the flange part 338 within the range of the measuring force not exceeding the pressing force of the coil spring 350.

As illustrated in FIG. 2, the stylus 336 includes: the flange part 356 supported by the stylus holder 346 as described above; a rod part 360 configured to extend from the flange part 356 in the axial direction O; and the contact part 362 provided at the tip of the rod part 360.

As illustrated in FIG. 2, the base end of the rod part 360 is attached to the flange part 356. The spherical contact part 362 to be in contact with the object W to be measured is provided at the tip of the rod part 360, i.e., the stylus 336 has the contact part 362 to be in contact with the object W to be measured.

Figure 5A:
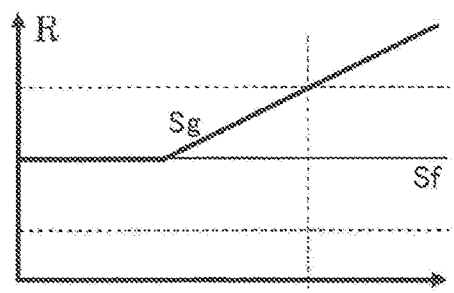
FIG. 5A is a diagram showing an operation of the defect judging part of FIG. 4 and showing a relationship between a gradually-changing generated signal and a predetermined fixed value.
Figure 5D:
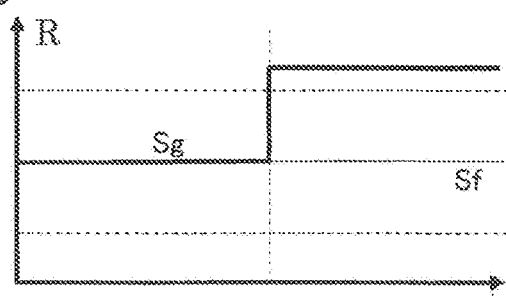
FIG. 5D is a diagram showing an operation of the defect judging part of FIG. 4 and showing a relationship between an abruptly-changing generated signal and a predetermined fixed value.
Figure 5B:
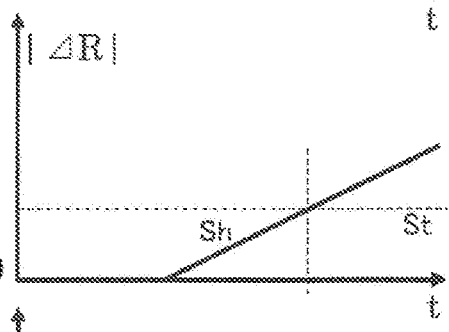
FIG. 5B is a diagram showing a relationship between a predetermined threshold and a judged signal calculated for the generated signal in FIG. 5A in a fixed difference part.
Figure 5E:
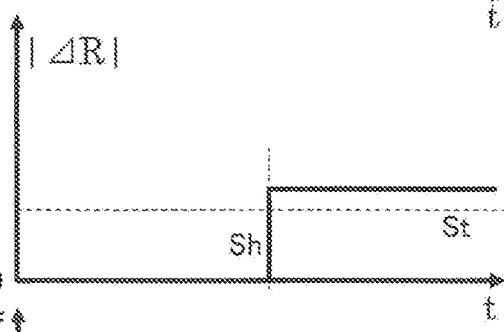
FIG. 5E is a diagram showing a relationship between a predetermined threshold and a judged signal calculated for the generated signal in FIG. 5D in the fixed difference part.
Figure 5C:
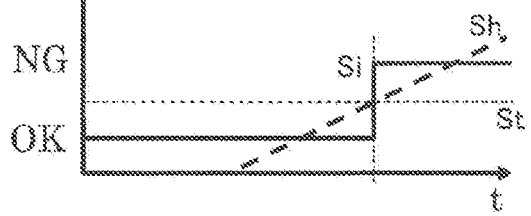
FIG. 5C is a diagram showing a judged result for the judged signal in FIG. 5B in a fixed comparison part.
Figure 5F:
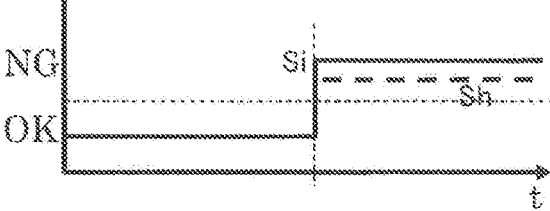
FIG. 5F is a diagram showing a judged result for the judged signal in FIG. 5E in the fixed comparison part.

A procedure of judging a defect of the measuring probe 300 will be described next with reference to FIGS. 3 to 6. FIGS. 5A to 5F are diagrams showing operations of the defect judging part 372. In particular, FIGS. 5A to 5C show a case where the generated signal Sg has changed due to, for example, the occurrence of gradual plastic deformation of the detection element 325 as a result of the long-term use of the measuring probe 300 and gradual detachment of the bonded detection element 325 from the arm part 324B. FIGS. 5D to 5F, on the other hand, show a case where the generated signal Sg has changed due to, for example, the occurrence of abrupt plastic deformation of the detection element 325 as a result of accidental (dropping, for example) impact of the measuring probe 300 and abrupt detachment of the bonded detection element 325 from the arm part 324B.

Note that the reference sign "R" denotes a magnitude of the generated signal Sg, the reference sign "|ΔR|" denotes a magnitude of the judged signal Sh, and the reference signs "OK" and "NG" denote an L level and an H level of the result signal Sr, respectively. The reference sign "t" denotes time.

Figure 6:
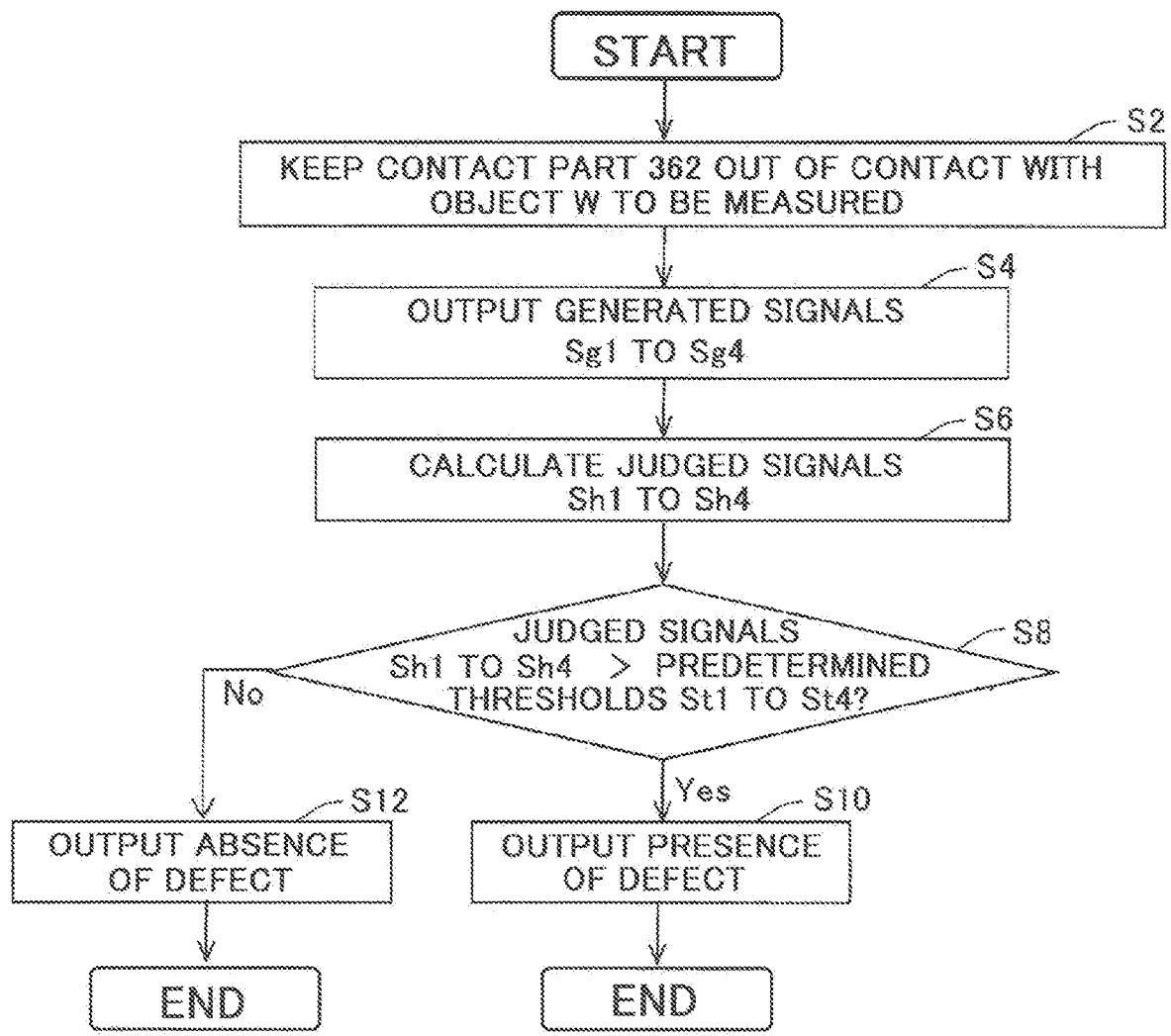
FIG. 6 is a flow chart showing operations of the defect judging unit of FIG. 3.

A state in which the contact part 362 is out of contact with the object W to be measured is created first (a step S2 in FIG. 6).

Next, the sensor signals Ss are outputted from the detection elements 325. The sensor signals Ss are amplified by the signal amplifying part 364 to generate the amplified signals Sa. Since the amplified signals Sa are the generated signals Sg, it can be regarded that the generated signals Sg (Sg1-Sg4) are outputted from the signal amplifying part 364 at this stage (a step S4 in FIG. 6).

Next, the generated signals Sg are inputted into the defect judging part 372 (FIGS. 5A and 5D). Consequently, the predetermined fixed values Sf are read out from the fixed value storage part 376 of the storage part 374, and fixed difference values, which are differences between the generated signals Sg and the predetermined fixed values Sf, are calculated as the judged signals Sh(Sh1-Sh4) in the fixed difference part 380 (a step S6 in FIG. 6) (FIGS. 5B and 5E). Specifically, the judged signal Sh1 is calculated from the generated signal Sg1 and the predetermined fixed value Sf1, the judged signal Sh2 is calculated from the generated signal Sg2 and the predetermined fixed value Sf2, the judged signal Sh3 is calculated from the generated signal Sg3 and the predetermined fixed value Sf3, and the judged signal Sh4 is calculated from the generated signal Sg4 and the predetermined fixed value Sf4.

Next, the judged signals Sh (Sh1-Sh4) are compared with the predetermined thresholds St (St1-St4) in the fixed comparison part 382 (a step S8 in FIG. 6). Specifically, the judged signal Sh1 is compared with the predetermined threshold St1, the judged signal Sh2 is compared with the predetermined threshold St2, the judged signal Sh3 is compared with the predetermined threshold St3, and the judged signal Sh4 is compared with the predetermined threshold St4.

If the judged signal Sh is greater than the predetermined threshold St (Yes in the step S8 in FIG. 6), the individual result signal Si at the H level is outputted. If the judged signal Sh is smaller than or equal to the predetermined threshold St (No in the step S8 in FIG. 6), the individual result signal Si at the L level is outputted. Such individual result signals Si are inputted into the operator OR. If any of the judged signals Sh is greater than the predetermined threshold St, it is judged that a defect exists and the result signal Sr at the H level is outputted (a step S10 in FIG. 6). If all of the judged signals Sh are smaller than or equal to the predetermined thresholds St, it is judged that no defect exists and the result signal Sr at the L level is outputted (a step S12 in FIG. 6). Note that FIGS. 5C and 5F each show a case where the individual result signal Si has changed from the absence of a defect to the presence of a defect along with change in the judged signal Sh.

Next, the result signal Sr is inputted into the judged result output part 390. What is displayed in the display part of the judged result output part 390 varies depending on whether the result signal Sr is at the H level or the L level. For example, if the result signal Sr is at the L level, which means the absence of a defect, the LED may be left turned on at all times. If the result signal Sr is at the H level, which means the presence of a defect, on the other hand, the LED may be caused to blink at given intervals.

Note that the procedure of judging a defect illustrated in FIG. 6 may be carried out before the use of the measuring probe 300 is started. Alternatively, even during use, such a procedure may be repeatedly carried out when the contact part 362 is out of contact with the object W to be measured, such as while the probe is being moved to a measurement position, for example.

A defect of the measuring probe 300 may occur due to usage conditions. For example, such defects include deformation of a part due to accidental impact (dropping) or the long-term use of the probe, and the detachment of the bonded strain gauge from the part.

If a user can clearly recognize deformation or breakage, or the detachment of the detection element 325 in the measuring probe 300 visually or by an error indication in a peripheral device, such a problem can be addressed easily.

If a small defect occurs inside the measuring probe 300, however, a user may fail to recognize such a problem easily. In such a case, there is a possibility that the user continues to use the measuring probe 300 without being aware of the defect.

In the present embodiment, in contrast, the defect judging part 372 and the judged result output part 390 are included in the measuring probe 300. Consequently, a defect judgment can be made on the basis of the sensor signals Ss from the detection elements 325 when the object W to be measured is not being measured. Thus, a useless measurement can be prevented from being made. That is, a measurement can efficiently be made with high reliability.

In the present embodiment, the generated signals Sg are the amplified signals Sa of the signal amplifying part 364. Thus, the generated signals Sg used for judging a defect can be obtained with an extremely simple configuration.

In the present embodiment, the four detection elements 325 are disposed at fourfold symmetry positions in the deformable arm parts 324B in the single supporting member 324. That is, a displacement of the contact part 362 on the plane (X-Y plane) where the axial direction O of the contact part 362 corresponds to a normal can be measured and judged without bias. At the same time, a displacement of the contact part 362 in the axial direction O (Z-direction) can also be measured and judged. That is, a three-dimensional displacement of the contact part 362 can be measured and judged precisely in conformity with the shape of the object W to be measured. Without being limited thereto, it is only necessary that at least one detection element be provided. For example, a measuring probe for accurately measuring only a one-dimensional displacement may be employed.

In the present embodiment, the detection element 325 is a strain gauge. Since strain gauges are widely used and easily handled at low cost, the cost of the measuring probe 300 can be lowered. Without being limited to such a strain gauge, a piezoelectric element, a semiconductor sensor, or an optical fiber sensor, for example, may be employed as a detection element.

In the present embodiment, the judged signal Sh is a fixed difference value, which is a difference between the generated signal Sg and the predetermined fixed value Sf, and the predetermined threshold St is a fixed threshold determined corresponding to the fixed difference value. The defect judging part 372 compares the fixed difference value with the fixed threshold. Thus, the configuration of the defect judging part 372 can be simplified. At the same time, since the fixed difference value is used as the judged signal Sh, the defect judging part 372 is suitable for judging a defect when the generated signal Sg varies relatively significantly due to impact, for example.

In the present embodiment, the predetermined fixed values Sf are the generated signals Sg initially obtained when the detection elements 325 are integrated into the measuring probe 300. In this embodiment, the predetermined fixed values Sf are individually set in the respective four detection elements 325. Thus, the predetermined fixed values Sf can also be acquired easily. Since a judgment is made on the basis of a change in the generated signal Sg from the initial state of the measuring probe 300, a final measurement accuracy level can be easily estimated on the basis of the initial measurement accuracy. Without being limited thereto, the predetermined fixed values Sf may be generated signals Sg obtained when the measuring probe is calibrated. Alternatively, only a generated signal Sg initially obtained in any one of the detection elements may be commonly used as the predetermined fixed values Sf.

In the present embodiment, the predetermined thresholds St have values different for each of the judged signals Sh. This enables a defect judgment without being affected by individual differences or variations (initial values) upon integration of the detection elements 325. Without being limited thereto, the same threshold value may be set for all of the judged signals Sh. In such a case, the predetermined thresholds St can be easily set without individual measurements by considering variations of the detection elements set forth in their catalog, for example.

In the present embodiment, the judged result output part 390 includes the display part (such as an LED) by which a judged result can be recognized. This allows for the downsizing of the defect judging unit 370, and the presence or absence of a defect can be understood at a glance. Of course, not only an LED but also a liquid crystal panel or an EL, for example, may be used as the display part. Without being limited thereto, the judged result output part may be configured to output the presence or absence of a defect via a speaker. The judged result output part may be in the form of a combination of a speaker and the above-described display part.

That is, in the present embodiment, the defect judging unit 370 and the defect judging method for the measuring probe 300 capable of ensuring measurement reliability with the simple configuration can be obtained.

Although the present invention has been described taking the first embodiment as an example, the present invention is not limited to the first embodiment. That is, modifications and design changes may be made thereto without departing from the scope of the present invention.

For example, although the amplified signals Sa outputted from the signal amplifying part 364 are directly inputted into the signal processing part 366 in the first embodiment, the present invention is not limited thereto. The amplified signals Sa may be processed as in a second embodiment illustrated in FIG. 7. The second embodiment differs from the first embodiment in that an offset correction part (an offset correction circuit) 467 configured to filter amplified signals Sa is provided between a signal amplifying part 464 and a signal processing part 466. Note that a description about elements of the second embodiment except for the configuration of the offset correction part 467 will be omitted here while their reference numerals are basically the same as those of the first embodiment except for their first digit.

Figure 7:
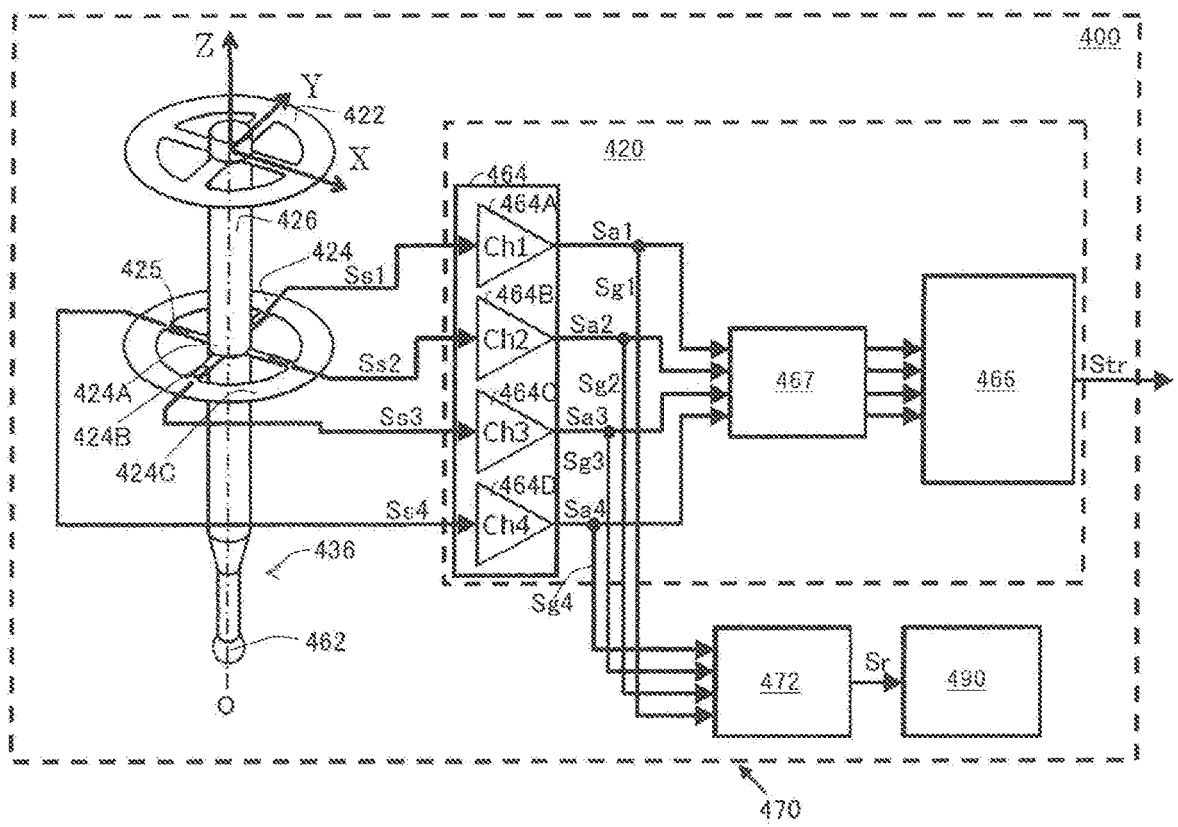
FIG. 7 is a block diagram showing a relationship between a measuring probe and a defect judging unit according to a second embodiment of the present invention.

In the second embodiment, providing the offset correction part 467 as illustrated in FIG. 7 makes it possible to reduce an offset signal caused when the orientation of a measuring probe 400 is changed or a stylus 436 to be used is changed, or an offset signal caused by a temperature change of the measuring probe 400. A bypass filter, for example, may be used in the offset correction part 467.

Although the offset correction part 467 is simply disposed between the signal amplifying part 464 and the signal processing part 466 in the second embodiment, the present invention is not limited thereto. For example, the offset correction part may be configured as in a third embodiment illustrated in FIG. 8. The third embodiment differs from the second embodiment in that an offset correction part 567 is formed as a feedback-type offset correction part. Note that a description about elements of the third embodiment except for the configuration of the offset correction part 567 will be omitted here while their reference numerals are basically the same as those of the second embodiment except for their first digit.

Figure 8:
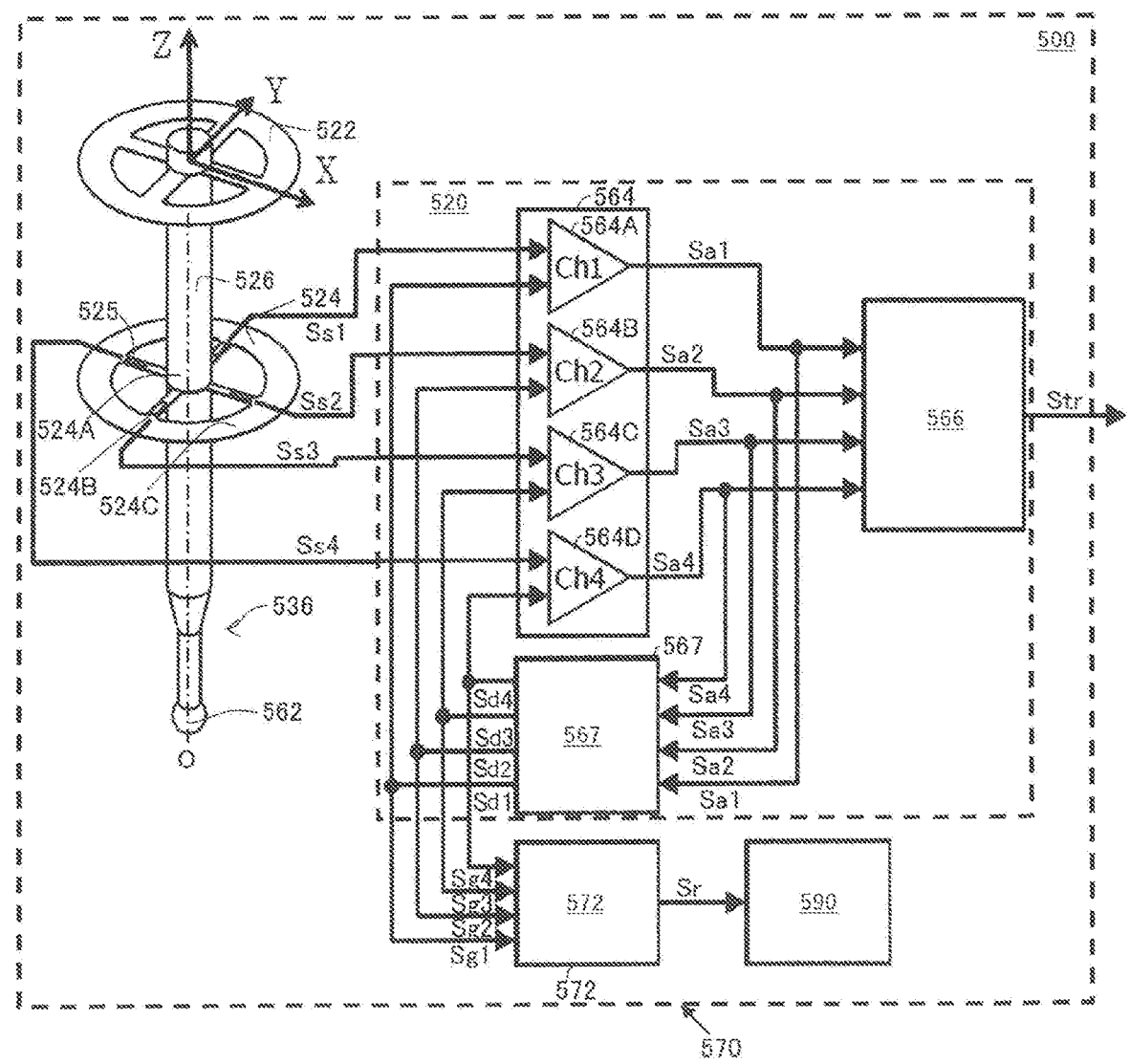
FIG. 8 is a block diagram showing a relationship between a measuring probe and a defect judging unit according to a third embodiment of the present invention.

In the third embodiment, there are provided a signal amplifying part 564 configured to perform differential amplification of each of outputs from detection elements 525, and the feedback-type offset correction part 567 connected to an input terminal and an output terminal of the signal amplifying part 564 as illustrated in FIG. 8. Generated signals Sg are offset signals Sd (Sd1 to Sd4) outputted from the offset correction part 567 and used to obtain differences from the outputs (sensor signals Ss) of the detection elements 525 in the signal amplifying part 564.

If the temperature of a measuring probe 500 and its surroundings changes, a temperature change in the detection elements 525 and a strain of peripheral parts including the detection elements 525 due to thermal expansion occur, thereby changing the sensor signals Ss. In view of this, the offset correction part 567 controls amplified signals Sa to be inputted into a signal processing part 566 so as not to change due to temperature. The amplified signal Sa, which is an output of the signal amplifying part 564, chiefly represents a short-term signal change generated by the contact of a contact part 562 with an object W to be measured. On the other hand, the offset signal Sd, which is an output of the offset correction part 567, represents a long-term (steady) signal change of the sensor signal Ss. For example, the offset signal Sd represents an output approximately proportional to a signal change caused when a slow change such as a temperature change of the measuring probe 500, an orientation change of the measuring probe 500, or a change of a stylus 536 to be used, for example, occurs.

Thus, employing such an offset signal Sd as a generated signal Sg in the present embodiment makes it possible to judge the presence or absence of a defect in the measuring probe 500.

Although the offset correction part 567 is configured to handle analog signals in the third embodiment, the present invention is not limited thereto. For example, the offset correction part may be configured as in a fourth embodiment illustrated in FIG. 9. The fourth embodiment differs from the third embodiment in that an offset correction part 667 is configured to handle digital signals. Note that a description about elements of the fourth embodiment except for the configurations of an A/D converter 665, the offset correction part 667, and a D/A converter 668 will be omitted here while their reference numerals are basically the same as those of the third embodiment except for their first digit.

Figure 9:
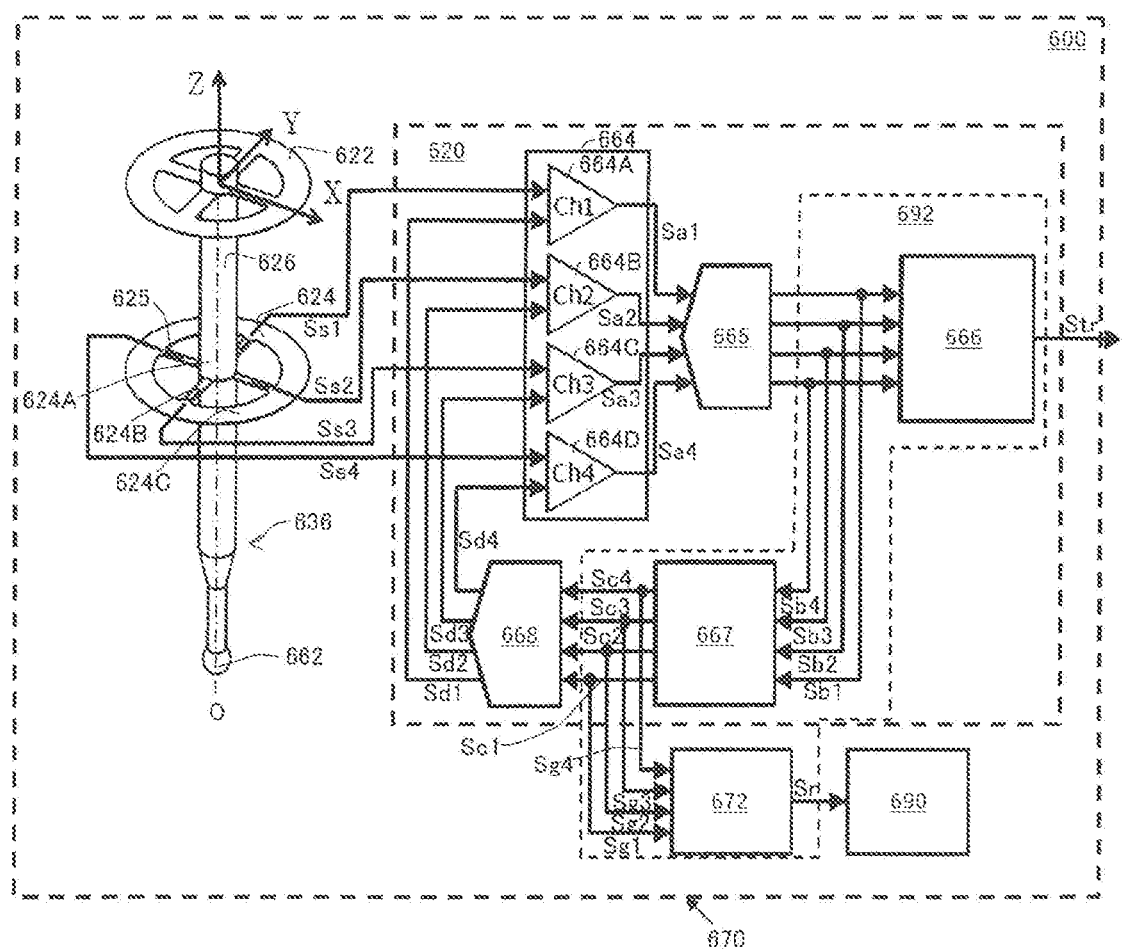
FIG. 9 is a block diagram showing a relationship between a measuring probe and a defect judging unit according to a fourth embodiment of the present invention.

In the fourth embodiment, the D/A converter 668 is provided between the offset correction part 667 and a signal amplifying part 664, and the A/D converter 665 is provided between the signal amplifying part 664 and a signal processing part 666 as illustrated in FIG. 9. The D/A converter 668 converts each of outputs of the offset correction part 667 to an analog signal. The A/D converter 665 converts each of outputs of the signal amplifying part 664 to a digital signal. Input signals from the signal amplifying part 664 into the offset correction part 667 are digital amplified signals Sb (Sb1 to Sb4) via the A/D converter 665. Generated signals Sg are digital offset signals Sc (Sc1 to Sc4) to be inputted into the signal amplifying part 664 via the D/A converter 668. Thus, the signal processing part 666, the offset correction part 667, and a defect judging part 672 constitute a digital signal processing part 692. That is, by embodying the digital signal processing part 692 using an FPGA, for example, the number of parts can be reduced only by the addition of a code (a software or a program) without using many hardware parts, and the necessary functions can be implemented (embodied) at low cost.

Although the judged signal Sh in the first embodiment is a fixed difference value, which is a difference between the generated signal Sg and the predetermined fixed value Sf, the present invention is not limited thereto. For example, the judged signals Sh may be configured as in a fifth embodiment shown in FIGS. 10 and 11A to 11E. The fifth embodiment differs from the first embodiment in that a judged signal Sh is a variable difference value obtained from (being) a difference between generated signals Sg. Note that a description about elements of the fifth embodiment except for the configuration of a defect judging part 772 will be omitted here while their reference numerals are basically the same as those of the first embodiment except for their first digit.

Figure 10:
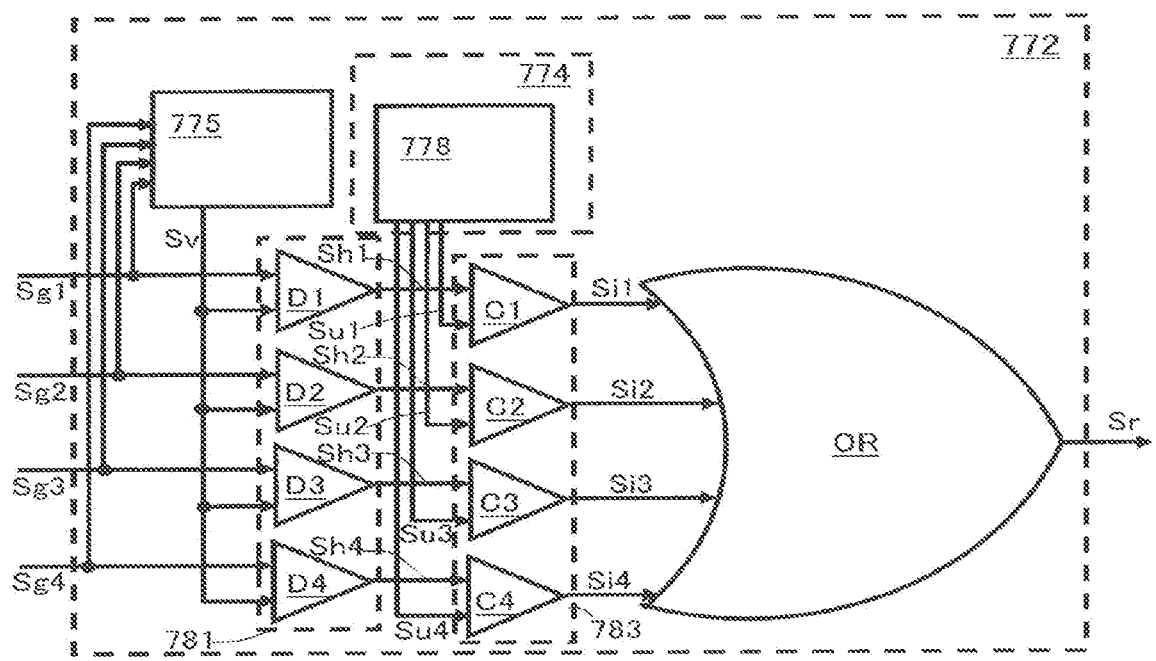
FIG. 10 is a block diagram showing a configuration of a defect judging part according to a fifth embodiment of the present invention.

In the fifth embodiment, the defect judging part 772 includes a storage part 774, a difference value operating part 775, a variable difference part 781, a variable comparison part 783, and an operator OR as illustrated in FIG. 10.

The storage part 774 includes a threshold storage part 778 and stores variable thresholds corresponding to variable difference values (described later) as predetermined thresholds Su (Su1 to Su4). The difference value operating part 775 sets any one of currently-obtained generated signals Sg as a variable reference signal Sv. Alternatively, the difference value operating part 775 sets an average of all of the currently-obtained generated signals Sg as the variable reference signal Sv. The variable difference part 781 obtains variable difference values, which are differences between the currently-obtained generated signals Sg and the variable reference signal Sv, as the judged signals Sh in respective differentiators D1 to D4. The variable comparison part 783 compares the judged signals Sh with the predetermined thresholds Su in respective comparators C1 to C4. If the judged signal Sh is greater than the predetermined threshold Su, which represents an NG case, the variable comparison part 783 outputs an individual result signal Si at an H level. On the other hand, if the judged signal Sh is smaller than or equal to the predetermined threshold Su, which represents an OK case, the variable comparison part 783 outputs the individual result signal Si at an L level. That is, the defect judging part 772 compares the variable difference values with the variable thresholds, respectively. The operator OR outputs an H-level signal as a result signal Sr only when any of the individual result signals Si is at the H level.

Figure 11A:
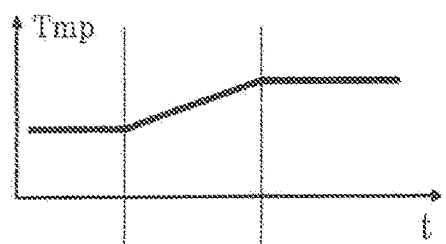
FIG. 11A is a diagram showing an operation of the defect judging part in FIG. 10 and showing that temperature changes with time.
Figure 11B:
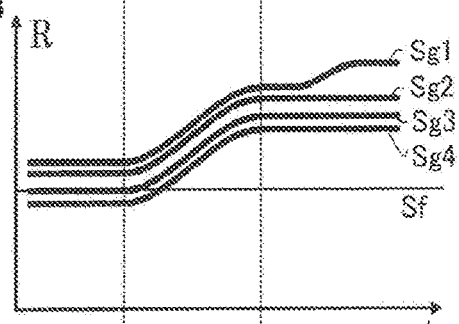
FIG. 11B is a diagram showing generated signals changing due to the temperature change in FIG. 11A.

When judging a defect of minute plastic deformation generated in a detection element due to repeated use of a measuring probe, for example, the predetermined threshold Su needs to be set relatively small in order to detect a small change in the judged signal Sh. If temperature (Tmp) of the measuring probe changes with time t as illustrated in FIG. 11A, however, the generated signals Sg may significantly change as illustrated in FIG. 11B as a result of temperature dependency of the detection elements and a strain caused by a difference in thermal expansion between the detection elements and the supporting member. That is, even when the generated signals Sg have substantially no changes excluding the effects of a temperature change, or even when the generated signals Sg only have practically negligible changes, the predetermined thresholds (variable thresholds) Su may be exceeded by the effects of the temperature change. Thus, the defect judging method using the defect judging part 372 of the first embodiment has a possibility that the generated signals Sg are affected by a temperature change and a wrong defect judgment is made even when the measuring probe or the detection elements included therein have no defects.

In the present embodiment, in order to avoid such a wrong judgment due to a temperature change, the generated signals Sg are intercompared with one another. Changes in generated signals Sg due to temperature exhibit approximately the same tendencies if the configurations of the detection elements and peripheral parts are the same. Thus, the judged signals Sh are obtained as shown in the following Expressions (1) to (3) with a single generated signal Sg4, for example, used as the variable reference signal Sv.

$$Sh1 = Sg1 - Sv(=Sg4) \quad (1)$$

$$Sh2 = Sg2 - Sv(=Sg4) \quad (2)$$

$$Sh3 = Sg3 - Sv(=Sg4) \quad (3)$$

Figure 11D:
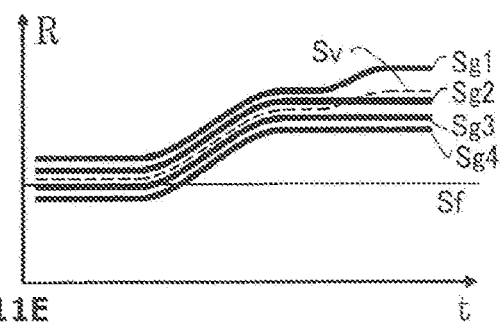
FIG. 11D is a diagram showing the generated signals changing due to the temperature change in FIG. 11A and an average signal of all of the generated signals.
Figure 11C:
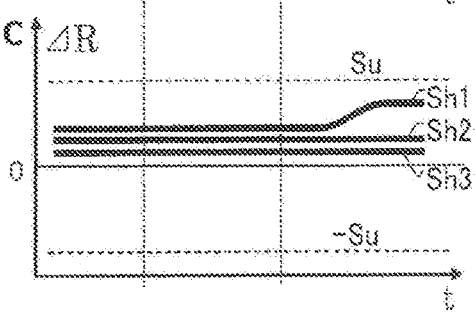
FIG. 11C is a diagram showing judged signals obtained by differences from one of the generated signals in FIG. 11B.

This yields the judged signals Sh that have eliminated the temperature effects as illustrated in FIG. 11C, and it can be judged that the measuring probe has no defect.

When any one of the generated signals Sg is used as the variable reference signal Sv, however, results may vary depending on which generated signal Sg is selected if sensor signals Ss widely vary. In Expressions (1) to (3), for example, the generated signal Sg4 is used as the variable reference signal Sv. If the generated signal Sg3 is used as the variable reference signal Sv, however, an acceptable amount of change with respect to the predetermined threshold Su changes. That is, a defect judgment may vary depending on which generated signal Sg is used as the variable reference signal Sv. In view of this, a signal obtained in Expression (8) by averaging all of the generated signals Sg can be used as the variable reference signal Sv in the present embodiment in order to eliminate defect judgment differences due to different selected generated signals Sg. In this case, the judged signals Sh are obtained as shown in the following Expressions (4) to (7).

$$Sh1 = Sg1 - Sv \quad (4)$$

$$Sh2 = Sg2 - Sv \quad (5)$$

$$Sh3 = Sg3 - Sv \quad (6)$$

$$Sh4 = Sg4 - Sv \quad (7)$$

$$Sv = (Sg1 + Sg2 + Sg3 + Sg4)/4 \quad (8)$$

Figure 11E:
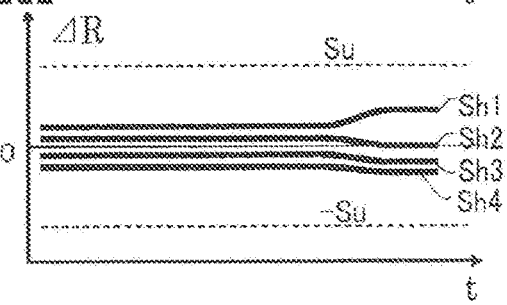
FIG. 11E is a diagram showing judged signals obtained by differences from the average signal in FIG. 11D.

The variable reference signal Sv in this case takes on a shape as indicated by a broken line in FIG. 11D. The judged signals Sh take on shapes as illustrated in FIG. 11E, and it can be judged that the measuring probe has no defect.

The judged signal Sh in the first embodiment is a fixed difference value, which is a difference between the generated signal Sg and the predetermined fixed value Sf, and the judged signal Sh in the fifth embodiment is a variable difference value obtained from a difference between the generated signals Sg. The present invention, however, is not limited thereto. For example, the judged signal Sh may be configured as in a sixth embodiment illustrated in FIG. 12. The sixth embodiment differs from the first and fifth embodiments in that a judged signal Sh includes both a fixed difference value and a variable difference value. Note that description about elements of the sixth embodiment except for the configuration of a defect judging part 872 will be omitted here while their reference numerals are basically the same as those of the first and fifth embodiments except for their first digit.

Figure 12:
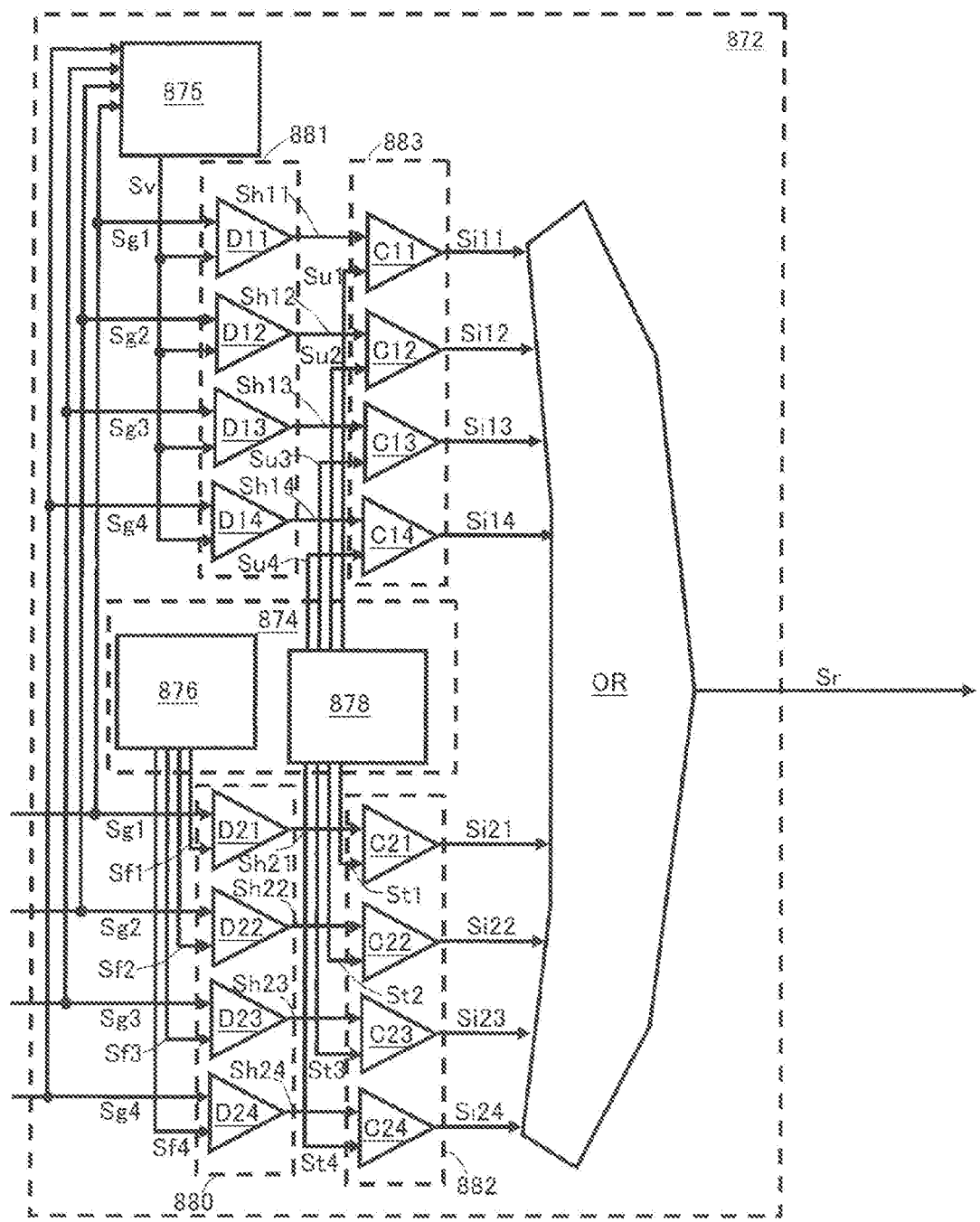
FIG. 12 is a block diagram showing a configuration of a defect judging part according to a sixth embodiment of the present invention.

In the sixth embodiment, the defect judging part 872 has both functions of the defect judging parts 372 and 772 as illustrated in FIG. 12. That is, the defect judging part 872 includes a storage part 874, a difference value operating part 875, a fixed difference part 880, a variable difference part 881, a fixed comparison part 882, a variable comparison part 883, and an operator OR.

The storage part 874 includes a fixed value storage part 876 configured to store predetermined fixed values Sf, and a threshold storage part 878. The threshold storage part 878 stores fixed thresholds corresponding to fixed difference values and variable thresholds corresponding to variable difference values as predetermined thresholds St and Su. The difference value operating part 875 sets any one of currently-obtained generated signals Sg as a variable reference signal Sv. Alternatively, the difference value operating part 875 sets an average of all of the currently-obtained generated signals Sg as the variable reference signal Sv. The fixed difference part 880 obtains fixed difference values, which are differences between the generated signals Sg and the predetermined fixed values Sf, as judged signals Sh (Sh21 to Sh24) in respective differentiators D21 to D24. The variable difference part 881 obtains variable difference values, which are differences between the variable reference signal Sv and the currently-obtained generated signals Sg, as judged signals Sh (Sh11 to Sh14) in respective differentiators D11 to D14. The fixed comparison part 882 compares the judged signals Sh (Sh21 to Sh24) with the predetermined thresholds St (St1 to St4) in respective comparators C21 to C24. If the judged signals Sh (Sh21 to Sh24) are greater than the predetermined thresholds St (St1 to St4), which represents an NG case, the fixed comparison part 882 outputs individual result signals Si (Si21 to Si24) at an H level. On the other hand, if the judged signals Sh (Sh21 to Sh24) are smaller than or equal to the predetermined thresholds St (St1 to St4), which represents an OK case, the fixed comparison part 882 outputs the individual result signals Si (Si21 to Si24) at an L level. The variable comparison part 883 compares the judged signals Sh (Sh11 to Sh14) with the predetermined thresholds Su (Su1 to Su4) in respective comparators C11 to C14. If the judged signals Sh (Sh11 to Sh14) are greater than the predetermined thresholds Su (Su1 to Su4), which represents an NG case, the variable comparison part 883 outputs individual result signals Si (Si11 to Si14) at an H level. On the other hand, if the judged signals Sh (Sh11 to Sh14) are smaller than or equal to the predetermined thresholds Su (Su1 to Su4), which represents an OK case, the variable comparison part 883 outputs the individual result signals Si (Si11 to Si14) at an L level. The operator OR outputs an H-level signal as a result signal Sr only when any of the individual result signals Si (Si11 to Si14 and Si21 to Si24) is at the H level.

Such a configuration in the present embodiment allows for judging a defect sensitively.

Although the defect judging part 872 includes the defect judging part 372 and the defect judging part 772 substantially directly disposed in parallel and the operator OR is commonly used therebetween in the sixth embodiment, the present invention is not limited thereto. For example, the defect judging part may be configured as in a seventh embodiment illustrated in FIG. 13. The seventh embodiment differs from the sixth embodiment in that only predetermined thresholds St are used in comparison with judged signals Sh in a fixed comparison part 982. Note that a description about elements of the seventh embodiment except for the configuration of a defect judging part 972 will be omitted here while their reference numerals are basically the same as those of the sixth embodiment except for their first digit.

Figure 13:
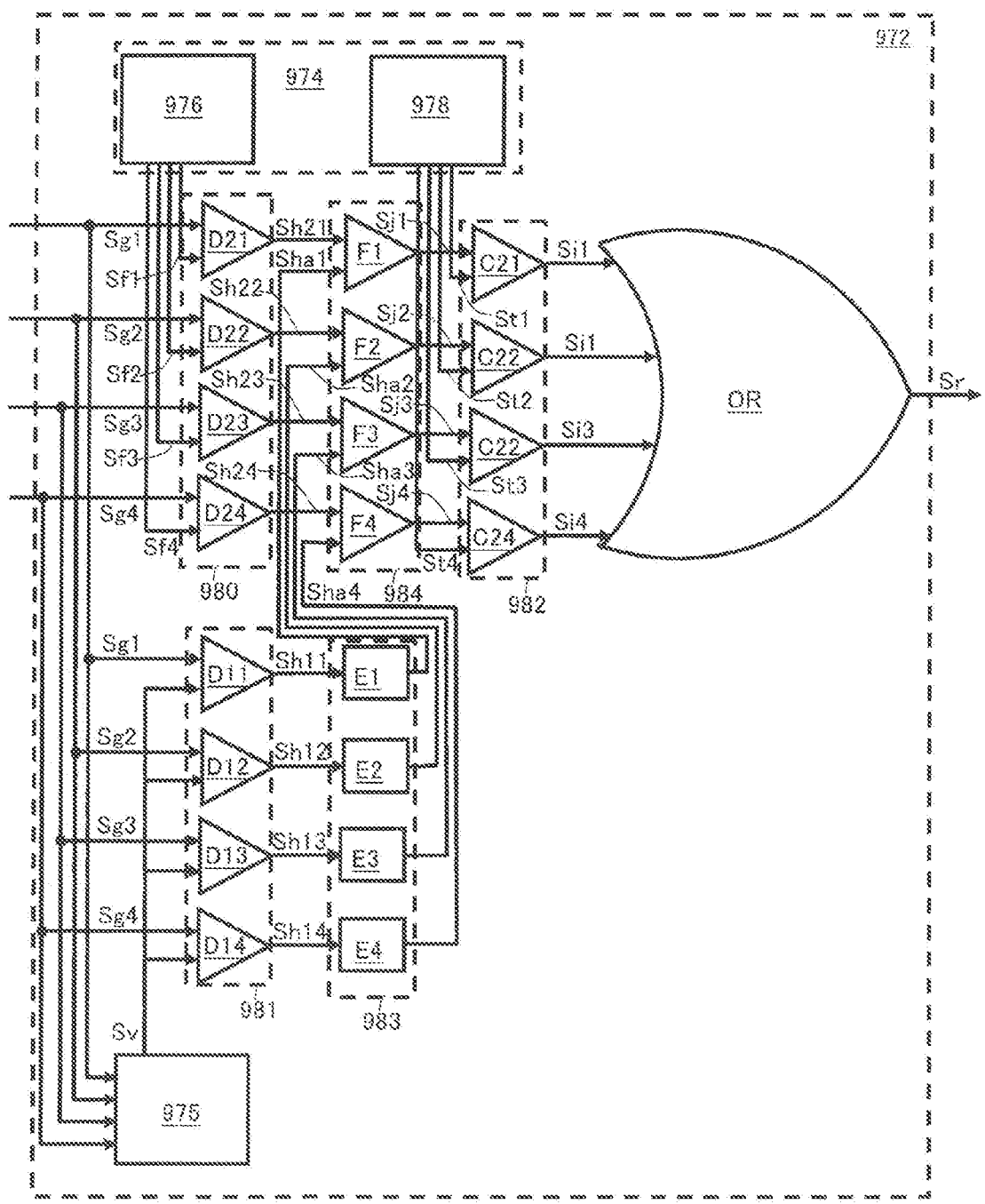
FIG. 13 is a block diagram showing a configuration of a defect judging part according to a seventh embodiment of the present invention.

In the seventh embodiment, the defect judging part 972 includes a storage part 974, a difference value operating part 975, a fixed difference part 980, a variable difference part 981, the fixed comparison part 982, a constant multiple part 983, a judged value comparison part 984, and an operator OR as illustrated in FIG. 13.

The storage part 974 includes a fixed value storage part 976 and a threshold storage part 978. The fixed value storage part 976 stores generated signals Sg initially obtained when detection elements are integrated into a measuring probe as predetermined fixed values Sf. The generated signals Sg in this case vary for each of the detection elements. The threshold storage part 978 stores fixed thresholds corresponding to fixed difference values as predetermined thresholds St. The difference value operating part 975 sets any one of currently-obtained generated signals Sg as a variable reference signal Sv. Alternatively, the difference value operating part 975 sets an average of all of the currently-obtained generated signals Sg as the variable reference signal Sv. The fixed difference part 980 obtains fixed difference values, which are differences between the generated signals Sg and the predetermined fixed values Sf, as judged signals Sh (Sh21 to Sh24) in respective differentiators D21 to D24. The variable difference part 981 obtains variable difference values, which are differences between the variable reference signal Sv and the currently-obtained generated signals Sg, as judged signals Sh (Sh11 to Sh14) in respective differentiators D11 to D14. The constant multiple part 983 multiplies the judged signals Sh (Sh11 to Sh14) by ratios of the fixed thresholds to the variable thresholds (see FIG. 12) in respective constant multipliers E1 to E4 to output calibrated judged signals Sha (Sha1 to Sha4), respectively, as shown in Expression (9).

$$Sha(Sha1 \text{ to } Sha4) = Sh(Sh11 \text{ to } Sh14) * St/Su \quad (9)$$

That is, the constant multiple part 983 enables the judged value comparison part 984 to compare the judged signals Sh (Sh11 to Sh14) with the judged signals Sh (Sh21 to Sh24) on an equal basis. The judged value comparison part 984 compares the judged signals Sh (Sh21 to Sh24) with the calibrated judged signals Sha (Sha1 to Sha4) in respective selectors F1 to F4, and outputs larger values as judged values Sj (Sj1 to Sj4). The fixed comparison part 982 compares the judged values Sj (Sj1 to Sj4) with predetermined thresholds St (St1 to St4) in respective comparators C21 to C24. If the judged values Sj are greater than the predetermined thresholds St, which represents an NG case, the fixed comparison part 982 outputs individual result signals Si (Si1 to Si4) at an H level. On the other hand, if the judged values Sj are smaller than or equal to the predetermined thresholds St, which represents an OK case, the fixed comparison part 982 outputs the individual result signals Si at an L level. The operator OR outputs an H-level signal as a result signal Sr only when any of the individual result signals Si (Si1 to Si4) is at the H level.

Although only the predetermined thresholds St (St1 to St4) are used in the present embodiment, the same defect judgment as the sixth embodiment can be made.

Figure 14A:
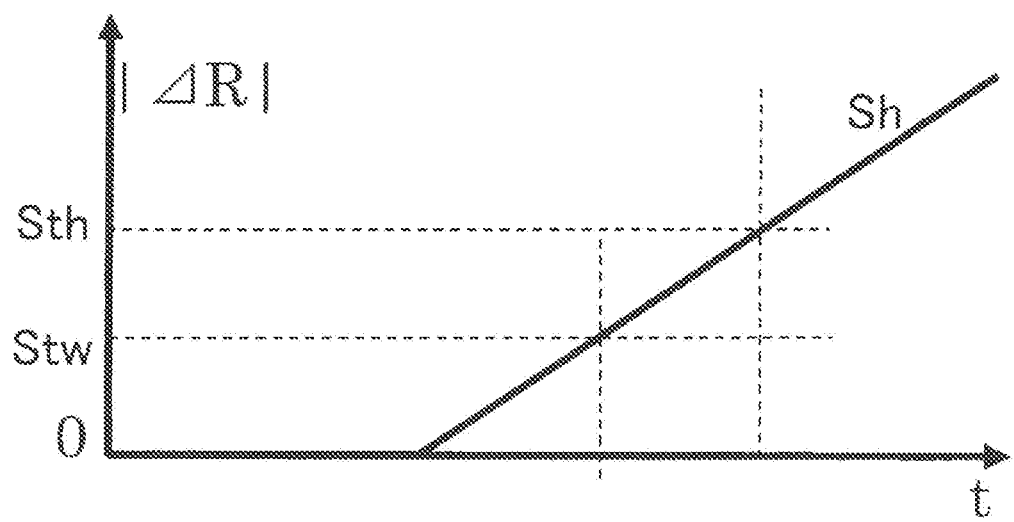
FIG. 14A is a diagram showing a judged signal according to an eighth embodiment of the present invention and showing a relationship between the judged signal and predetermined thresholds.
Figure 14B:
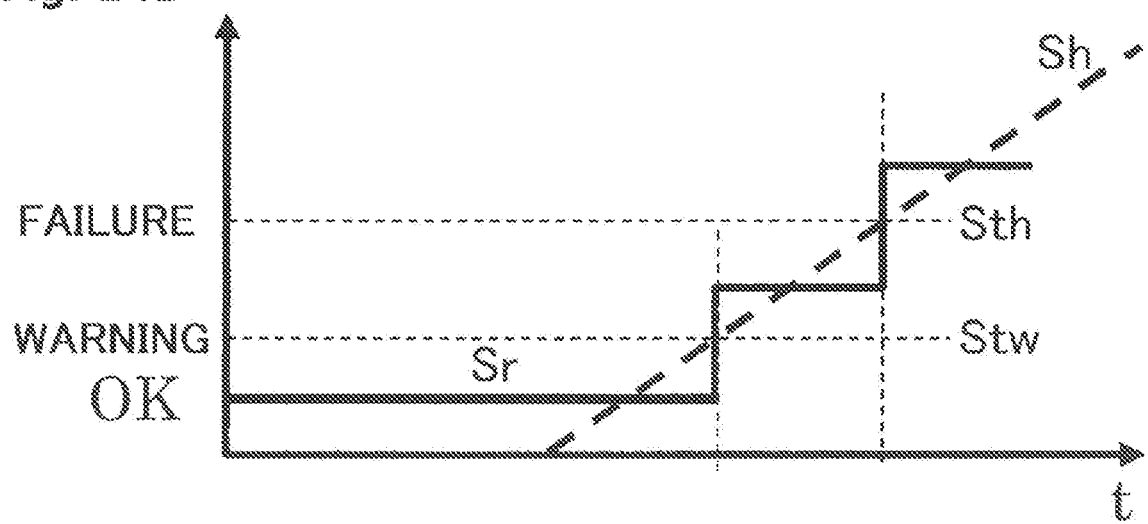
FIG. 14B is a diagram showing a judged result for the judged signal in FIG. 14A in a fixed comparison part.

Although a single predetermined threshold St or a single predetermined threshold Su is provided for a single judged signal Sh and the comparison parts make an OK or NG judgment in the above embodiments, the present invention is not limited thereto. For example, those may be configured as in an eighth embodiment illustrated in FIGS. 14A and 14B. In the eighth embodiment, two predetermined thresholds Sth and Stw are provided for a single judged signal Sh and a judged result output part is configured to output a level of a defect in two levels as illustrated in FIGS. 14A and 14B. This allows for making a defect judgment such as "warning or failure" according to levels of the predetermined thresholds Sth and Stw. Without being limited thereto, two or more predetermined thresholds may be provided, and two or more defect levels may be provided.

Although the defect judging unit includes the measuring probe in each of the above-described embodiments, a defect judging unit may be constituted solely by a part of processing generated signals in a measuring probe. Alternatively, part of a defect judging unit may be part of a host computer, and a defect judging part and a judged result output part may be provided in the host computer. The presence or absence of a defect and the description of the defect may be displayed in a monitor of the host computer.

A result signal outputted from the defect judging part may be transmitted to the motion controller or the host computer, and if a defect occurs during the execution of an automatic measurement by a program, for example, the automatic measurement may be stopped.

The present invention can be widely applied to measuring probes and measuring systems used for measuring a three-dimensional shape of an object to be measured.

It should be apparent to those skilled in the art that the above-described embodiments are merely illustrative which represent the application of the principles of the present invention. Numerous and varied other arrangements can be readily devised by those skilled in the art without departing from the spirit and the scope of the present invention.

The invention claimed is:

1. A defect judging unit comprising:
   a measuring probe comprising:
   a stylus having a contact part being contactable with an object to be measured;
   a probe housing configured to support the stylus on an axial center;
   at least one support having a rotationally-symmetric shape and disposed in an axial direction of the probe housing to provide for an orientation change of the stylus, the at least one support comprising four deformable arms;
   four detectors each configured to detect a movement of the contact part, each detector of the four detectors being disposed at fourfold symmetry positions on a respective said arm of the four deformable arms; and
   a signal processor configured to process a generated signal obtained from an output of the four detectors to output a touch signal;
   a defect judging circuit configured to compare at least one judged signal corresponding to the generated signal with a predetermined threshold when the object to be measured and the contact part are out of contact with each other and judge that a defect exists if any of the at least one judged signal is greater than the predetermined threshold; and a judged result output device configured to output a judged result of the defect judging circuit.

2. The defect judging unit according to claim 1, comprising a signal amplifying circuit configured to amplify the output of the four detectors, the signal amplifying circuit being provided before the signal processor, and wherein
the generated signal is an amplified signal of the signal amplifying circuit.

3. The defect judging unit of a measuring probe according to claim 2, comprising an offset correction circuit configured to filter the amplified signal, the offset correction circuit being provided between the signal amplifying circuit and the signal processing device processor.

4. The defect judging unit according to claim 1, comprising:
a signal amplifying circuit configured to perform differential amplification of the output of the four detectors; and
a feedback-type offset correction circuit connected to an input terminal and an output terminal of the signal amplifying circuit, and wherein
the generated signal is an offset signal outputted from the offset correction circuit and used to obtain a difference from the output of the four detectors in the signal amplifying circuit.

5. The defect judging unit according to claim 4, comprising:
a D/A converter configured to convert an output of the offset correction circuit to an analog signal, the D/A converter being provided between the offset correction circuit and the signal amplifying circuit; and
an A/D converter configured to convert an output of the signal amplifying circuit to a digital signal, the A/D converter being provided between the signal amplifying circuit and the signal processor, and wherein
an input signal from the signal amplifying circuit into the offset correction circuit is a digital amplified signal via the A/D converter,
the generated signal is a digital offset signal to be inputted into the signal amplifying circuit via the D/A converter, and
the signal processor, the offset correction circuit, and the defect judging circuit constitute a digital signal processor.

6. The defect judging unit according to claim 1, wherein the four detectors are strain gauges.

7. The defect judging unit according to claim 1, wherein the judged signal is a fixed difference value being a difference between the generated signal and a predetermined fixed value,
the predetermined threshold is a fixed threshold determined corresponding to the fixed difference value, and the defect judging circuit is configured to compare the fixed difference value with the fixed threshold.

8. The defect judging unit according to claim 7, wherein the predetermined fixed value is a generated signal initially obtained when the four detectors are integrated into the measuring probe.

9. The defect judging unit according to claim 1, wherein the judged signal includes: a fixed difference value being a difference between the generated signal and a predetermined fixed value; and a variable difference value being a difference between currently-obtained said generated signals and a variable reference signal that is any one of the currently-obtained generated signals or an average of all of the currently-obtained generated signals,
the predetermined threshold includes: a fixed threshold corresponding to the fixed difference value; and a variable threshold corresponding to the variable difference value, and
the defect judging circuit is configured to compare the fixed difference value with the fixed threshold and compare the variable difference value with the variable threshold.

10. The defect judging unit according to claim 1, wherein the judged signal is a variable difference value being a difference between currently-obtained said generated signals and a variable reference signal that is any one of the currently-obtained generated signals,
the predetermined threshold is a variable threshold corresponding to the variable difference value, and
the defect judging circuit is configured to compare the variable difference value with the variable threshold.

11. The defect judging unit according to claim 1, wherein the judged signal is a variable difference value being a difference between currently-obtained said generated signals and a variable reference signal that is an average of all of the currently-obtained generated signals,
the predetermined threshold is a variable threshold corresponding to the variable difference value, and
the defect judging circuit is configured to compare the variable difference value with the variable threshold.

12. The defect judging unit according to claim 1, wherein the predetermined threshold is a value different for each judged signal.

13. The defect judging unit according to claim 1, wherein two or more said predetermined thresholds are provided for a single said judged signal, and
the judged result output device is configured to output a level of the defect in two or more levels.

14. The defect judging unit according to claim 1, wherein the judged result output device is configured to include a display by which the judged result can be recognized.

* * * * *